United States Patent
Yamaguchi

(10) Patent No.: US 6,567,955 B1
(45) Date of Patent: May 20, 2003

(54) METHOD AND SYSTEM FOR APPROXIMATING DISTRIBUTED CONSTANT LINE

(75) Inventor: Masanori Yamaguchi, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/486,820

(22) PCT Filed: Aug. 31, 1998

(86) PCT No.: PCT/JP98/03874

§ 371 (c)(1),
(2), (4) Date: Mar. 2, 2000

(87) PCT Pub. No.: WO99/12110

PCT Pub. Date: Mar. 11, 1999

(30) Foreign Application Priority Data

Sep. 2, 1997 (JP) ............................................. 9-237261

(51) Int. Cl.[7] ............................................. G06F 17/50
(52) U.S. Cl. .................................. 716/4; 716/5; 716/15
(58) Field of Search .............................. 716/1–6, 10–18

(56) References Cited

U.S. PATENT DOCUMENTS

| | | | |
|---|---|---|---|
| 5,502,644 A | * | 3/1996 | Hamilton et al. ............... 716/5 |
| 5,546,321 A | * | 8/1996 | Chang et al. .................... 716/1 |
| 5,610,833 A | * | 3/1997 | Chang et al. .................. 716/11 |
| 5,708,587 A | * | 1/1998 | Franck et al. ................... 716/3 |
| 5,757,654 A | * | 5/1998 | Appel ............................ 716/1 |
| 6,058,256 A | * | 5/2000 | Mellen et al. ................. 716/12 |
| 6,161,215 A | * | 12/2000 | Hollenbeck et al. ........... 716/15 |
| 6,484,299 B1 | * | 11/2002 | Larsen ........................... 716/6 |

FOREIGN PATENT DOCUMENTS

EP    599469    6/1994

OTHER PUBLICATIONS

"Approximation of Transmission Lines by Partitioning", M. Yamaguchi, Institute of Electronics, Information and Communication Engineers (Corporate Aggregate), Engineering Sciences Society Conference 1997 Collected Lecture Theses, Japan, Aug. 13, 1997, p. 26.

"T–Equivalent Circuit of Distributed RC Line", Y. Miwa et al, Institute of Electronics, Information and Communication Engineers (Corporate Aggregate), Engineering Sciences Society Conference 1992 Collected Lecture Theses, Japan, Sep. 15, 1992, 1st Fascicule General Fundamentals and Boundaries, p. 31.

"On Handling a Conduit for Hydraulic Circuit Simulation (Comparison between a Lumped Constant Model and a Distributed Constant Model)", S. Murayama et al, Heisei 3–nen Hydraulics and Pneumatics Symposium Journal, Japan, The Japan Hydraulics and Pneumatics Society Corporate Aggregate), May 23, 1991, pp. 133–136.

* cited by examiner

Primary Examiner—Matthew Smith
Assistant Examiner—Paul Dinh
(74) Attorney, Agent, or Firm—Antonelli, Terry, Stout & Kraus, LLP

(57) ABSTRACT

A lumped constant line approximating system capable of approximating a distributed constant line with required accuracy. The system receives inputs of object circuit information and analysis conditions (Steps 310, 320), calculates a product $\gamma l$ of the propagation constant $\gamma$ and the line length l (Step 340), and calculates $\cosh \gamma l$ and $\sinh \gamma l$ by using the product $\gamma l$ (Step 360) to obtain functions $a_n(\gamma l)$, $b_n(\gamma l)$ and $c_n(\gamma l)$. Then, absolute values $\delta_1$, $\delta_2$ and $\delta_3$ of the differences between these functions and $\cosh \gamma l$ or $\sinh \gamma l$ are obtained, and compares the maximum $\delta$ among them with an error tolerance $\epsilon$. If $\delta < \epsilon$, the processing ends, while if $\delta < \epsilon$ is not satisfied, the number of division is increased by 1, and the above processing is repeated, until the number n of division for approximation is determined (Step 370). Using the determined number of division, a ladder circuit is defined, for example, by cascading Π circuits (Step 380), and stored (Step 400).

15 Claims, 9 Drawing Sheets

METHOD AND SYSTEM FOR APPROXIMATING DISTRIBUTED CONSTANT LINE

TECHNICAL FIELD

The present invention relates to a method of and a system for carrying out an approximation process for circuit analysis of a distributed constant line. In particular, the present invention relates to a method and a system for approximating a distributed constant line by a lumped constant circuit, with specified accuracy. The present invention also relates to a storage medium that stores a program used therefor.

BACKGROUND ART

With regard to a wiring system such as a printed board or a multilayer wiring board, it is required to carry out circuit analysis concerning whether the circuit realizes desired operation. Conventionally, analysis software has been developed for this object. By designating circuit elements constituting a circuit, a circuit model is specified, and then, the above-mentioned software is used for circuit analysis on a computer.

As LSIs are rapidly improved in their operating speed, a wiring system for transmitting signal between elements is required to have structure capable of transmitting a signal at high speed. To that end, it is necessary to sufficiently understand signal transmission characteristics of a wiring system. In that case, in order to realize high speed transmission, a wiring system should be treated as a transmission line so that its transmission characteristics can be understood accurately.

However, a circuit to be analyzed includes, in addition to transmission lines, circuit elements that should be treated as lumped constants. Thus, lumped constant and distributed constant coexist. However, circuit analysis of a lumped constant/distributed constant mixed system is difficult, since a travelling wave of voltage/current should be treated.

Thus, it is demanded to approximate a distributed constant line by a lumped constant circuit. In the approximation, it is desirable that the degree of accuracy of the approximation be known. Further, when the approximation accuracy becomes higher, a load on the processing becomes larger. Thus, in approximating a distributed constant line by a lumped constant circuit, it is desired that the approximation can be carried out with a required accuracy.

DISCLOSURE OF THE INVENTION

An object of the invention is to provide a process for approximating a distributed constant line by a lumped constant circuit, and, in particular, to provide a method and system for approximating a distributed constant line with a required accuracy, and a storage medium that stores a program used therefor.

To attain the above object, the present invention provides, according to its first mode, a method of approximating a distributed constant line, which employs an information processing apparatus to perform a process of approximating an object distributed constant line by a lumped constant circuit obtained by cascading a given unit lumped constant circuit in n stages, comprising the steps of:

calculating a product $\gamma l$ of a propagation constant $\gamma$ of the object distributed constant line and a line length $l$ of the distributed constant line, and storing the product;

calculating $\cosh \gamma l$ and $\sinh \gamma l$, using the $\gamma l$, and storing the $\cosh \gamma l$ and $\sinh \gamma l$;

calculating $a_n(\gamma l)$, $b_n(\gamma l)$ and $c_n(\gamma l)$ that constitute elements of a transfer matrix of the lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x = \gamma l$ and deciding n as a tentative value, and storing the $a_n(\gamma l)$, $b_n(\gamma l)$ and $c_n(\gamma l)$;

comparing the $\cosh \gamma l$ with $a_n(\gamma l)$, $\sinh \gamma l$ with $b_n(\gamma l)$, and $\sinh \gamma l$ with $c_n(\gamma l)$, respectively, to make a judgment on whether a result of comparison satisfies a predetermined condition, and, when the condition is not satisfied, repeating steps from the step of calculating the $a_n(\gamma l)$, $b_n(\gamma l)$ and $c_n(\gamma l)$, onward, changing the value of the n, until the result of comparison satisfies the condition; and deciding an approximate circuit, using n when the result of comparison satisfies the condition, in order to decide a lumped constant circuit that is obtained by cascading the unit lumped constant circuit in n stages.

In the above-described method, further, the following modes may be optionally employed.

a) The above-mentioned comparison is carried out by calculating a deviation between the $\cosh \gamma l$ and $a_n(\gamma l)$, a deviation between $\sinh \gamma l$ and $b_n(\gamma l)$, and a deviation between $\sinh \gamma l$ and $c_n(\gamma l)$, respectively, and the result of comparison is obtained as the maximum $\delta$ among those deviations; and a condition that the maximum $\delta$ satisfies $\delta < \epsilon$ for an error tolerance $\epsilon$ set in advance is used as the condition to make the judgment.

b) The above-mentioned lumped constant circuit is constituted by cascading a $\Pi$ circuit as the unit lumped constant circuit in n stages, and the transfer matrix of the lumped constant circuit is given by an expression:

$$F_\Pi = \begin{bmatrix} a_n(\gamma l) & Z_0 b_n(\gamma l) \\ \frac{1}{Z_0} c_n(\gamma l) & a_n(\gamma l) \end{bmatrix}$$

where $Z_0$ is a characteristic impedance of the distributed constant line.

c) The above-mentioned lumped constant circuit is constituted by cascading a T circuit as the unit lumped constant circuit in n stages, and the transfer matrix of the lumped constant circuit is given by an expression:

$$F_T = \begin{bmatrix} a_n(\gamma l) & Z_0 c_n(\gamma l) \\ \frac{1}{Z_0} b_n(\gamma l) & a_n(\gamma l) \end{bmatrix}$$

where $Z_0$ is a characteristic impedance of the distributed constant line.

d) Input of the error tolerance $\epsilon$ is received and stored;

and the received $\epsilon$ is used in the condition to decide the value of the n.

e) As the error tolerance $\epsilon$, a plurality of values are received and stored;

and each value of the received $\epsilon$ is used in the condition to decide the value of the n corresponding thereto.

Further, a second mode of the present invention provides a method of approximating a distributed constant line, which employs an information processing apparatus to perform a process of approximating an object distributed constant line by a lumped constant circuit obtained by cascading a given unit lumped constant circuit in n stages, comprising the steps of:

receiving input of a value of the n, and storing the value;

calculating a product $\gamma l$ of a propagation constant $\gamma$ of the object distributed constant line and a line length l of the distributed constant line, and storing the product;

calculating cosh $\gamma l$ and sinh $\gamma l$, using the $\gamma l$, and storing the cosh $\gamma l$ and sinh $\gamma l$;

calculating $a_n(\gamma l)$, $b_n(\gamma l)$ and $c_n(\gamma l)$ that constitute elements of a transfer matrix of the lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x=\gamma l$ and deciding n as the value inputted, and storing the $a_n(\gamma l)$, $b_n(\gamma l)$ and $c_n(\gamma l)$; and calculating a deviation between the cosh $\gamma l$ and $a_n(\gamma l)$, a deviation between sinh $\gamma l$ and $b_n(\gamma l)$, and a deviation between sinh $\gamma l$ and $c_n(\gamma l)$, respectively, obtaining the maximum $\delta$ among those deviations, and outputting the maximum $\delta$ as an error.

A third mode of the present invention provides a system for approximating an object distributed constant line by a lumped constant circuit, comprising:

means for storing object circuit information describing the distributed constant line as an object of approximation, and approximate circuit information defining a lumped constant circuit obtained by cascading a given unit lumped constant circuit in n stages;

means for calculating a product $\gamma l$ of a propagation constant $\gamma$ of the object distributed constant line and a line length l of the distributed constant line based on the object circuit information;

means for calculating cosh $\gamma l$ and sinh $\gamma l$ using the $\gamma l$;

means for calculating each of $a_n(\gamma l)$, $b_n(\gamma l)$ and $c_n(\gamma l)$ that constitute elements of a transfer matrix of the lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x=\gamma l$ and deciding n as a tentative value;

means for deciding the n by comparing the cosh $\gamma l$ with $a_n(\gamma l)$, sinh $\gamma l$ with $b_n(\gamma l)$, and sinh $\gamma l$ with $c_n(\gamma l)$, respectively, to make a judgment on whether a result of comparison satisfies a predetermined condition, and, when the condition is not satisfied, by repeating processes from a process of calculating the $a_n(\gamma l)$, $b_n(\gamma l)$ and $c_n(\gamma l)$, onward, changing the value of the n, until the result of comparison satisfies the condition; and means for deciding an approximate circuit, the means using n when the result of comparison satisfies the condition, in order to decide, as the approximate circuit, a lumped constant circuit that is obtained by cascading the unit lumped constant circuit in n stages.

In the above-mentioned system, further, the following modes may be optionally employed.

f) The above-mentioned means for deciding n:

carries out the comparison by calculating a deviation between the cosh $\gamma l$ and $a_n(\gamma l)$, a deviation between sinh $\gamma l$ and $b_n(\gamma l)$, and a deviation between sinh $\gamma l$ and $c_n(\gamma l)$, respectively, to obtain the result of comparison as the maximum $\delta$ among those deviations; and makes the judgment by using a condition that the maximum $\delta$ and an error tolerance $\epsilon$ set in advance satisfy $\delta<\epsilon$, as the condition.

g) The above-mentioned system further comprises means for receiving designation from outside;

the means for storing possesses approximate circuit information on a lumped constant circuit constituted by cascading a $\Pi$ circuit as the unit lumped constant circuit in n stages, and approximate circuit information on a lumped constant circuit constituted by cascading a T circuit as the unit lumped constant circuit in n stages;

the means for calculating $a_n(\gamma l)$, $b_n(\gamma l)$ and $c_n(\gamma l)$ calculates $a_n(\gamma l)$, $b_n(\gamma l)$ and $c_n(\gamma l)$ concerning the lumped constant circuit constituted by cascading, in n stages, the unit lumped constant circuit that is designated through the means for receiving designation between the $\Pi$ circuit and T circuit; and the means for deciding the approximate circuit decides, as the approximate circuit, the lumped constant circuit constituted by cascading the designated unit lumped constant circuit in n stages.

Further, a fourth mode of the present invention provides a system for approximating an object distributed constant line by a lumped constant circuit, wherein, the system comprises:

a storage device for storing a program and data; and a central processing unit for executing the program to perform the approximation;

the storage device stores object circuit information describing the distributed constant line as an object of approximation, and approximate circuit information defining a lumped constant circuit obtained by cascading a given unit lumped constant circuit in n stages; and the central processing unit carries out processes of:

calculating a product $\gamma l$ of a propagation constant $\gamma$ of the object distributed constant line and a line length l of the distributed constant line based on the object circuit information;

calculating cosh $\gamma l$ and sinh $\gamma l$ using the $\gamma l$;

calculating each of $a_n(\gamma l)$, $b_n(\gamma l)$ and $c_n(\gamma l)$ that constitute elements of a transfer matrix of the lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x = \gamma l$ and deciding n as a tentative value;

deciding the n by comparing the cosh $\gamma l$ with $a_n(\gamma l)$, sinh $\gamma l$ with $b_n(\gamma l)$, and sinh $\gamma l$ with $c_n(\gamma l)$, respectively, to make a judgment on whether a result of comparison satisfies a predetermined condition, and, when the condition is not satisfied, by repeating the processes from the process of calculating the $a_n(\gamma l)$, $b_n(\gamma l)$ and $c_n(\gamma l)$, onward, changing the value of the n, until the result of comparison satisfies the condition; and deciding an approximate circuit, using n when the result of comparison satisfies the condition, in order to decide, as the approximate circuit, a lumped constant circuit that is obtained by cascading the unit lumped constant circuit in n stages.

Further, a fifth mode of the present invention provides a program recorded medium in which a program for making an information processing apparatus execute a process of approximating an object distributed constant line by a lumped constant circuit obtained by cascading a given unit lumped constant circuit in n stages is recorded, wherein:

the program makes the information processing apparatus execute processes of:

calculating a product $\gamma l$ of a propagation constant $\gamma$ of the object distributed constant line and a line length l of the distributed constant line based on the object circuit information;

calculating cosh $\gamma l$ and sinh $\gamma l$ using the $\gamma l$;

calculating each of $a_n(\gamma l)$, $b_n(\gamma l)$ and $c_n(\gamma l)$ that constitute elements of a transfer matrix of the lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x = \gamma l$ and deciding n as a tentative value;

deciding the n by comparing the cosh $\gamma l$ with $a_n(\gamma l)$, sinh $\gamma l$ with $b_n(\gamma l)$, and sinh $\gamma l$ with $c_n(\gamma l)$, respectively, to make a judgment on whether a result of comparison satisfies a predetermined condition, and, when the condition is not satisfied, by repeating the processes from the process of calculating the $a_n(\gamma l)$, $b_n(\gamma l)$ and $c_n(\gamma l)$, onward, changing the value of the n, until the result of comparison satisfies the condition; and deciding an approximate circuit, using n when the result of comparison satisfies the condition, in order to decide, as the approximate circuit, a lumped constant circuit obtained by cascading the unit lumped constant circuit in n stages.

Further, a sixth mode of the present invention provides a program for making an information processing apparatus execute line by a lumped constant circuit obtained by cascading a given unit lumped constant circuit n stages, wherein:

the program makes the information processing apparatus execute processes of:

calculating a product $\gamma l$ of a propagation constant $\gamma$ of the object distributed constant line and a line length l of the distributed constant line based on the object circuit information describing the object distributed constant line;

calculating cosh $\gamma l$ and sinh $\gamma l$ using the $\gamma l$;

calculating each of $a_n(\gamma l)$, $b_n(\gamma l)$ and $c_n(\gamma l)$ that constitute elements of a transfer matrix of the lumped constant line, for functions $a_n(\chi)$, $b_n(\chi)$ and $c_n(\chi)$ defined by the following three expressions:

$$a_n(\chi) = \sum_{k=0}^{n} \frac{(n+k-1)!}{n^{2k-1}(n-k)!} \frac{\chi^{2k}}{(2k)!}$$

$$b_n(\chi) = \sum_{k=0}^{n-1} \frac{(n+k)!}{n^{2k+1}(n-k-1)!} \frac{\chi^{2k+1}}{(2k+1)!}$$

$$c_n(\chi) = \sum_{k=0}^{n} \frac{\left(n^2 + \frac{k}{2}\right)(n+k-1)!}{n^{2k+1}(n-k)!} \frac{\chi^{2k+1}}{(2k\ 1)!}$$

putting $\chi = \gamma l$ and deciding n as a tenative value;

deciding the n by comparing the cosh $\gamma l$ with $a_n(\gamma l)$, sinh $\gamma l$ with $b_n(\gamma l)$, and sinh ($\gamma l$) with $c_n(\gamma l)$, respectively, to make a judgement on whether a result of comparison staisfies a predetermined condition, and, wherein the condition is not satisfied, by repeating the processes from the process of calculating the $a_n(\gamma l)$, $b_n(\gamma l)$ and $c_n(\gamma l)$, onward, changing the value of the n, until the result of comparison satisfies the condition; and deciding an approximate circuit, using n when the result of comparison satisfies the condition, in order to decide, as the approximate circuit, the lumped constant circuit that is obtained by cascading the unit lumped constant circuit in n stages.

Here, for example, the program makes the comparison carried out by calculating a deviation between the cosh γl and $a_n(\gamma l)$, a deviation between sinh γl and $b_n(\gamma l)$, and a deviation between sinh γl and $c_n(\gamma l)$, respectively, to obtain the result of comparison as the maximum δ among those deviations; and makes the judgment carried out by using a condition that the maximum δ and an error tolerance ε set in advance satisfy δ<ε, as the condition.

According to the present invention, a circuit board including a wiring system to be treated as a distributed constant line can be approximated as a whole by a lumped constant circuit. In addition, in approximating a distributed constant line by a lumped constant circuit, the approximation can be carried out with required accuracy. Thus, there is such effect that the accuracy of the analysis becomes clear. Further, it is possible to know the accuracy with which the approximation is carried out.

BEST MODE FOR CARRYING OUT THE INVENTION

In the following, the best mode for carrying out the present invention will be described referring to the figures.

Before the description of the embodiment, the principle of the present invention will be described.

Generally, a relation between an input voltage $V_1$ and an input current $I_1$ and an output voltage $V_2$ and an output current $I_2$ in a two-terminal-pair (four-port) circuit can be expressed as an expression (1) using a transfer matrix (F matrix).

$$\begin{bmatrix} V_1 \\ I_1 \end{bmatrix} = F \begin{bmatrix} V_2 \\ I_2 \end{bmatrix} \tag{1}$$

Figure 1:
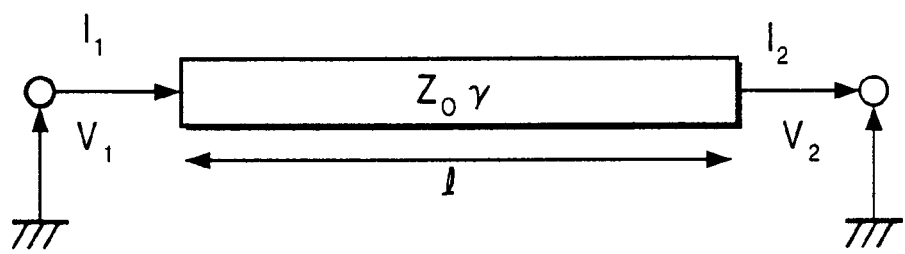
FIG. 1 is an explanatory view schematically showing a distributed constant line.

Now, it is assumed that a distributed constant line as an object of the present invention is shown in FIG. 1. Namely, it is a line having a line length of l, and its parameters are shown in Table 1.

TABLE 1

| Parameters of a distributed constant line | |
|---|---|
| R | Resistance per a unit length |
| L | Inductance per a unit length |
| G | Conductance per a unit length |
| C | Capacitance per a unit length |
| l | Line length |
| $Z_0$ | Characteristic impedance |
| γ | Propagation constant |

The characteristic impedance $Z_0$ and the propagation constant γ are given by the expression (2) and the expression (3):

$$z_0 = \sqrt{\frac{R + j\omega L}{G + j\omega C}} \tag{2}$$

Using these constants, the F matrix $F_0$ of the distributed constant line is expressed by the expression (4):

$$F_0 = \begin{bmatrix} \cosh \gamma l & Z_0 \sinh \gamma l \\ \frac{1}{Z_0} \sinh \gamma l & \cosh \gamma l \end{bmatrix} \tag{4}$$

Figure 2:
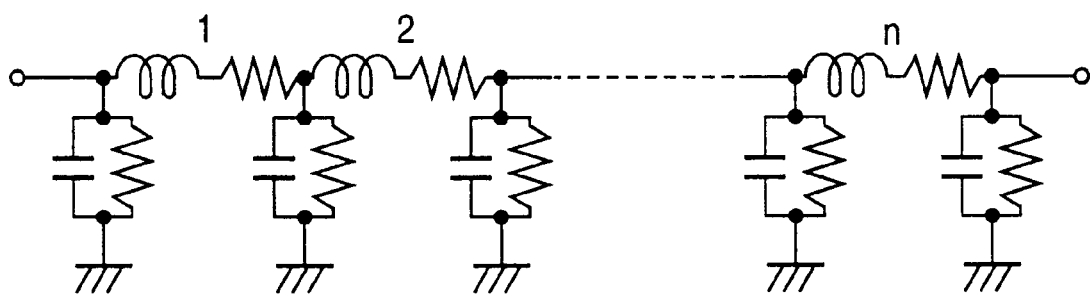
FIG. 2 is a circuit diagram showing an approximate lumped constant circuit obtained by dividing a distributed constant line into n subintervals, and by expressing each subinterval by a Π circuit.
Figure 3:
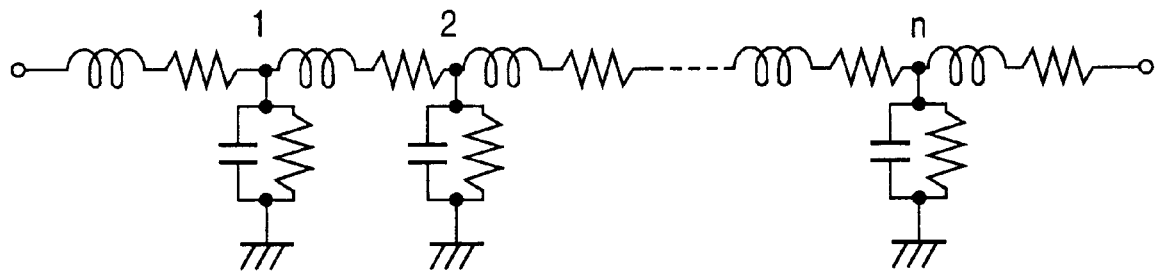
FIG. 3 is a circuit diagram showing an approximate lumped constant circuit obtained by dividing a distributed constant line into n subintervals, and by expressing each subinterval by a T circuit.

Here, it is considered that the distributed constant line shown in FIG. 1 is divided into n subintervals, and each subinterval is approximated by a unit lumped constant circuit. For approximation, the unit lumped constant circuit that approximates a subinterval may be considered to be a Π circuit or a T circuit, for example. FIG. 2 is an example of a lumped constant circuit in which each subinterval is expressed by a Π circuit. FIG. 3 is an example of a lumped constant circuit in which each subinterval is expressed by a T circuit.

Now, further, the Π circuit (see FIG. 4) as one subinterval taken from the circuit of FIG. 2, and the T circuit (see FIG. 5) as one subinterval taken from the circuit of FIG. 3 will be considered. F matrices $F_{\Pi n}$, $F_{Tn}$ for respective subintervals are given by the expressions (5), (6).

$$F_{\Pi n} = \begin{bmatrix} 1 + \frac{l^2}{2n^2}(R+j\omega L)(G+j\omega C) & \frac{l}{n}(R+j\omega L) \\ \frac{l}{n}(G+j\omega C)\left\{1 + \frac{l^2}{4n^2}(R+j\omega L)(G+j\omega C)\right\} & 1 + \frac{l^2}{2n^2}(R+j\omega L)(G+j\omega C) \end{bmatrix} \quad (5)$$

$$F_{Tn} = \begin{bmatrix} 1 + \frac{l^2}{2n^2}(R+j\omega L)(G+j\omega C) & \frac{l}{n}(G+j\omega C)\left\{1 + \frac{l^2}{4n^2}(R+j\omega L)(G+j\omega C)\right\} \\ \frac{l}{n}(G+j\omega C) & 1 + \frac{l^2}{2n^2}(R+j\omega L)(G+j\omega C) \end{bmatrix} \quad (6)$$

Using $Z_0$ and $\gamma$, these expressions can be rewritten into the expressions (7) and (8), respectively.

$$F_{\Pi n} = \begin{bmatrix} 1 + \frac{(\gamma l)^2}{2n^2} & Z_0 \frac{\gamma l}{n} \\ \frac{1}{Z_0} \frac{\gamma l}{n}\left\{1 + \frac{(\gamma l)^2}{4n^2}\right\} & 1 + \frac{(\gamma l)^2}{2n^2} \end{bmatrix} \quad (7)$$

$$F_{Tn} = \begin{bmatrix} 1 + \frac{(\gamma l)^2}{2n^2} & Z_0 \frac{\gamma l}{n}\left\{1 + \frac{(\gamma l)^2}{4n^2}\right\} \\ \frac{1}{Z_0} \frac{\gamma l}{n} & 1 + \frac{(\gamma l)^2}{2n^2} \end{bmatrix} \quad (8)$$

When, the subintervals are cascaded in n stages to constitute the circuit structures shown in FIGS. 2 and 3, their F matrices $F_\Pi$, $F_T$ are each obtained by multiplying $F_{\Pi n}$, or $F_{Tn}$ n times, thus yielding the expressions (9) and (10).

$$F_\Pi = F^n_{\Pi n} \quad (9)$$

$$F_T = F^n_{Tn} \quad (10)$$

By actual calculation, these expressions give the expressions (11) and (12).

$$F_\Pi = \begin{bmatrix} a_n(\gamma l) & Z_0 b_n(\gamma l) \\ \frac{1}{Z_0} c_n(\gamma l) & a_n(\gamma l) \end{bmatrix} \quad (11)$$

$$F_T = \begin{bmatrix} a_n(\gamma l) & Z_0 c_n(\gamma l) \\ \frac{1}{Z_0} b_n(\gamma l) & a_n(\gamma l) \end{bmatrix} \quad (12)$$

Here, in the expressions (11) and (12), $a_n$, $b_n$ and $c_n$ are functions expressed by the following expressions (13), (14) and (15), respectively.

$$a_n(x) = \sum_{k=0}^{n} \frac{(n+k-1)!}{n^{2k-1}(n-k)!} \frac{x^{2k}}{(2k)!} \quad (13)$$

$$b_n(x) = \sum_{k=0}^{n-1} \frac{(n+k)!}{n^{2k+1}(n-k-1)!} \frac{x^{2k+1}}{(2k+1)!} \quad (14)$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!} \quad (15)$$

As described above, it is clear that, when the distributed constant line is divided into subintervals and is approximated by the lumped constant line, the F matrix of the approximate circuit can be obtained. Further, now, it is necessary to examine the approximating accuracy of the circuit that approximates the distributed constant line.

In order that we can say that the lumped constant line approximating the distributed constant line is the correct approximation of the real distributed constant line, comparing $F_\Pi$, $F_T$ of the above expressions (11), (12) with $F_0$ of the expression (4), the function $a_n$ should correctly approximate a hyperbolic cosine, cosh, and the functions $b_n$ and $c_n$ a hyperbolic sine, sinh, respectively. Further, as the number of division becomes larger, $F_\Pi$, $F_T$ should approach to $F_0$. Thus, obtaining the limit in the state that the division becomes infinitesimally fine in the expressions (13), (14) and (15), i.e., in the state that n becomes the infinity, we have the expressions (16) and (17).

$$\lim_{n \to \infty} a_n(x) = \sum_{k=0}^{\infty} \frac{x^{2k}}{(2k)!} \quad (16)$$

$$\lim_{n \to \infty} b_n(x) = \lim_{n \to \infty} c_n(x) = \sum_{k=0}^{\infty} \frac{x^{2k+1}}{(2k+1)!} \quad (17)$$

The right sides of the expressions (16) and (17) are the Taylor's expansions of cosh and sinh, respectively. Thus, as the number of terms is increased, $a_n$ approaches to cosh, and $b_n$ and $c_n$ to sinh. So, the expressions (11) and (12) are appropriate as approximation of the distributed constant line, and the division becomes finer, the degree of approximation becomes higher.

However, since the number of division can not be an infinity of large, it will be further examined what degree of division is required for appropriate accuracy of approximation from a practical point of view. Here, for the sake of simplicity, the distributed constant line is assumed to be lossless, and $F_\Pi$ and $F_T$ are compared with $F_0$ in the case that one wavelength is divided into n portions. Writing the wavelength as $\lambda$, then, $l/\lambda=1$ in the following equation:

$$\gamma l = j2\pi \frac{l}{\lambda} \quad (18)$$

Then, $F_0$ is expressed by the following expression.

$$F = \begin{bmatrix} \cosh(j2\pi) & Z_0 \sinh(j2\pi) \\ \frac{1}{Z_0}\sinh(j2\pi) & \cosh(j2\pi) \end{bmatrix} = \begin{bmatrix} 1 & 0 \\ 0 & 1 \end{bmatrix} \quad (19)$$

Figure 6:
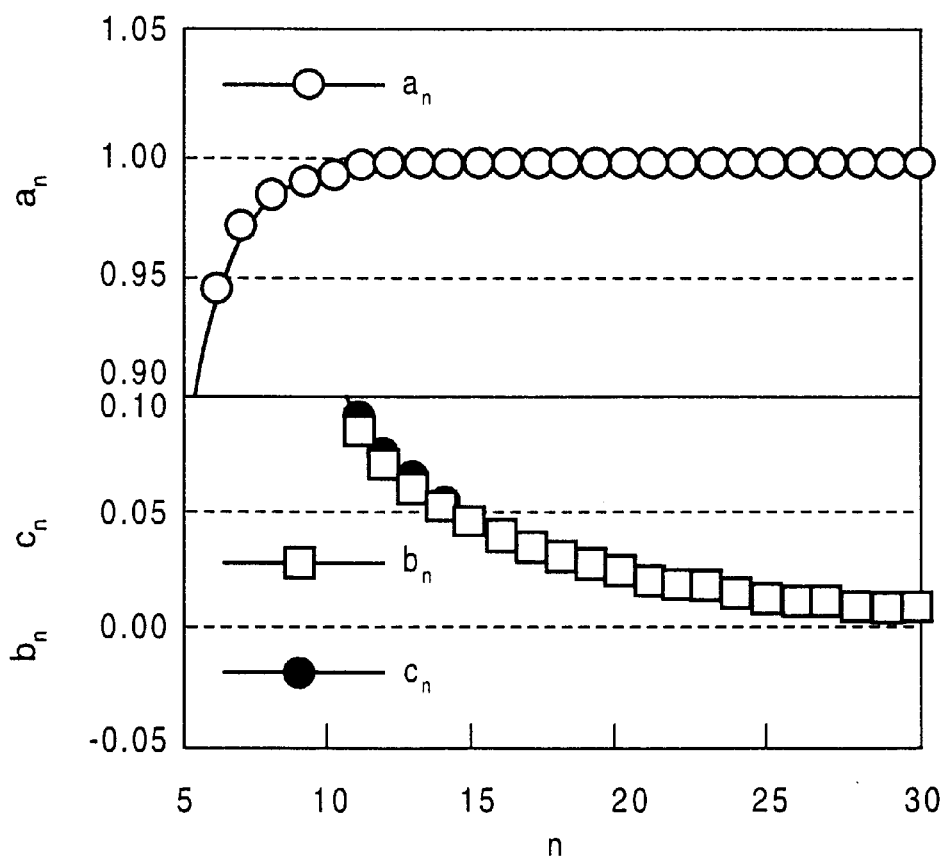
FIG. 6 is a graph showing degree of approximation in relation to the number of division n.

Now, substituting an actual value for n in $a_n$, $b_n$ and $c_n$ in the expressions (11) and (12), values of those functions are calculated. Then, the approximating accuracy is higher as $a_n$ is closer to 1 and $b_n$ and $c_n$ to 0. Values of $a_n$, $b_n$ and $c_n$ for n are shown in FIG. 6. As shown in FIG. 6, when $n \geq 15$ for example, $a_n$ becomes almost 1, and $b_n$ and $c_n$ become 0.05 or less.

Next, approximation of an object circuit will be described utilizing the property of the distributed constant line that it can be approximated with desired accuracy by the above-described approximation model.

Figure 7:
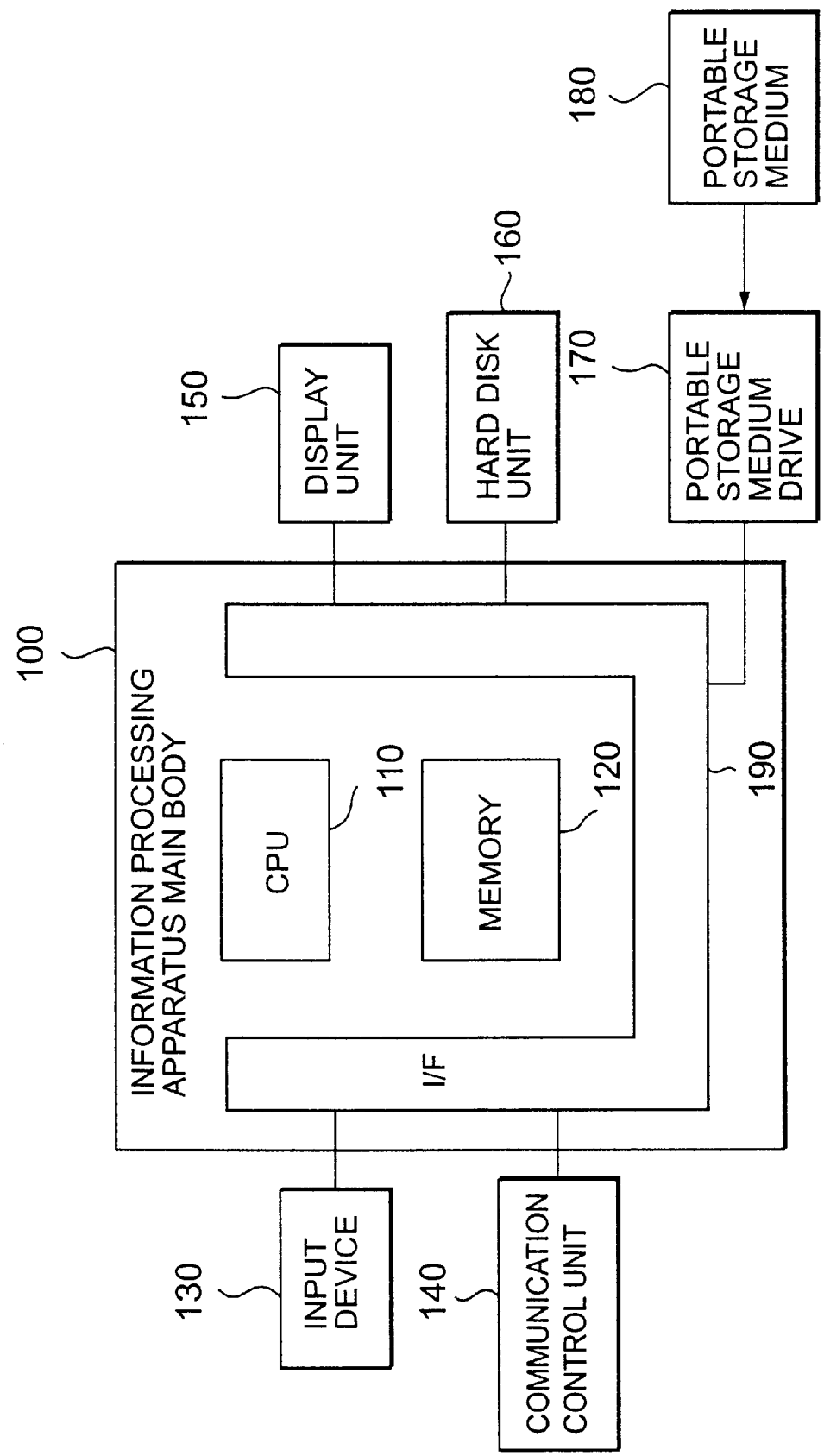
FIG. 7 is a block diagram showing a system configuration of hardware resources constituting the system of the present invention.

Here will be described an example in which the process is performed using an information processing apparatus shown in FIG. 7. As the information processing apparatus, one that can execute the below-mentioned operation will suffice. The information processing apparatus shown in FIG. 7 comprises: a main body 100 of the information processing apparatus, having a central processing unit (CPU) 110, a memory 120 and an interface 190; an input device 130 for inputting a directive instruction or the like; a communication control unit 140 for sending/receiving information to and from another apparatus via communication means; a display unit 150 for displaying a result of the processing; a hard disk unit 160 for storing data, programs, and the like; and a portable storage medium drive 170 for driving a portable storage medium 180. Although this example uses the hard disk unit as a storage device, the storage device is not limited to the hard disk.

The above-mentioned input device 130 comprises, for example, a keyboard, and has a device for pointing a position, such as a mouse.

As the portable storage medium 180, may be used a rewritable storage medium such as a floppy disk, a magneto-optical disk, for example. Further, a read-only storage medium such as a CD-ROM may be used. In the present invention, a program executed by the CPU 110 may be provided being recorded in the CD-ROM, for example. Then, the program is installed into the hard disk 160, loaded into the memory 120, and executed by the CPU 110. In the following description, the memory 120 and the hard disk unit 160 are distinguished from each other. However, those two may be taken together as a storage device as a whole.

Figure 8:
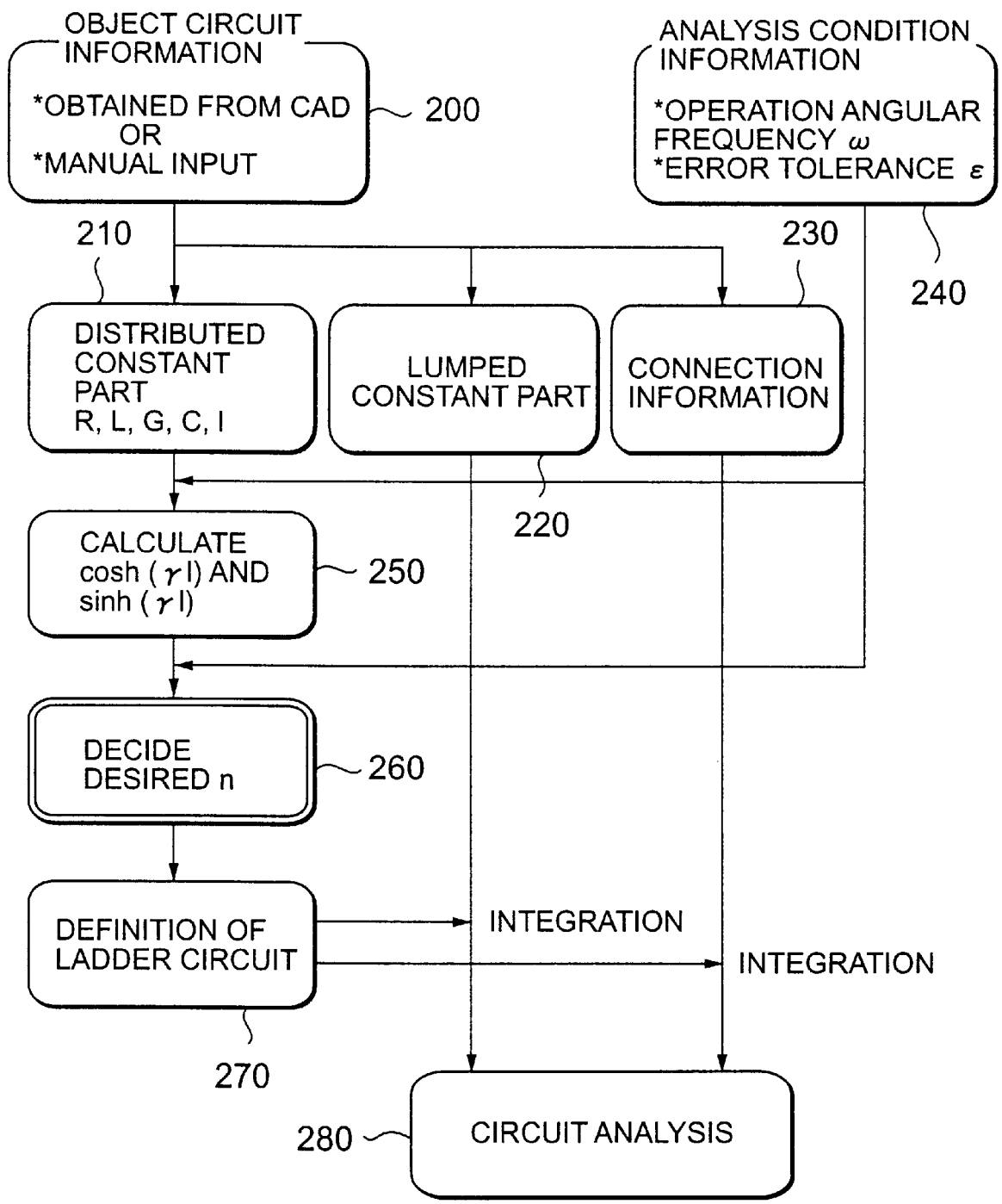
FIG. 8 is an explanatory view showing a relation between data to be processed and the process flow in the distributed constant approximation process to which the present invention is applied.
Figure 9:
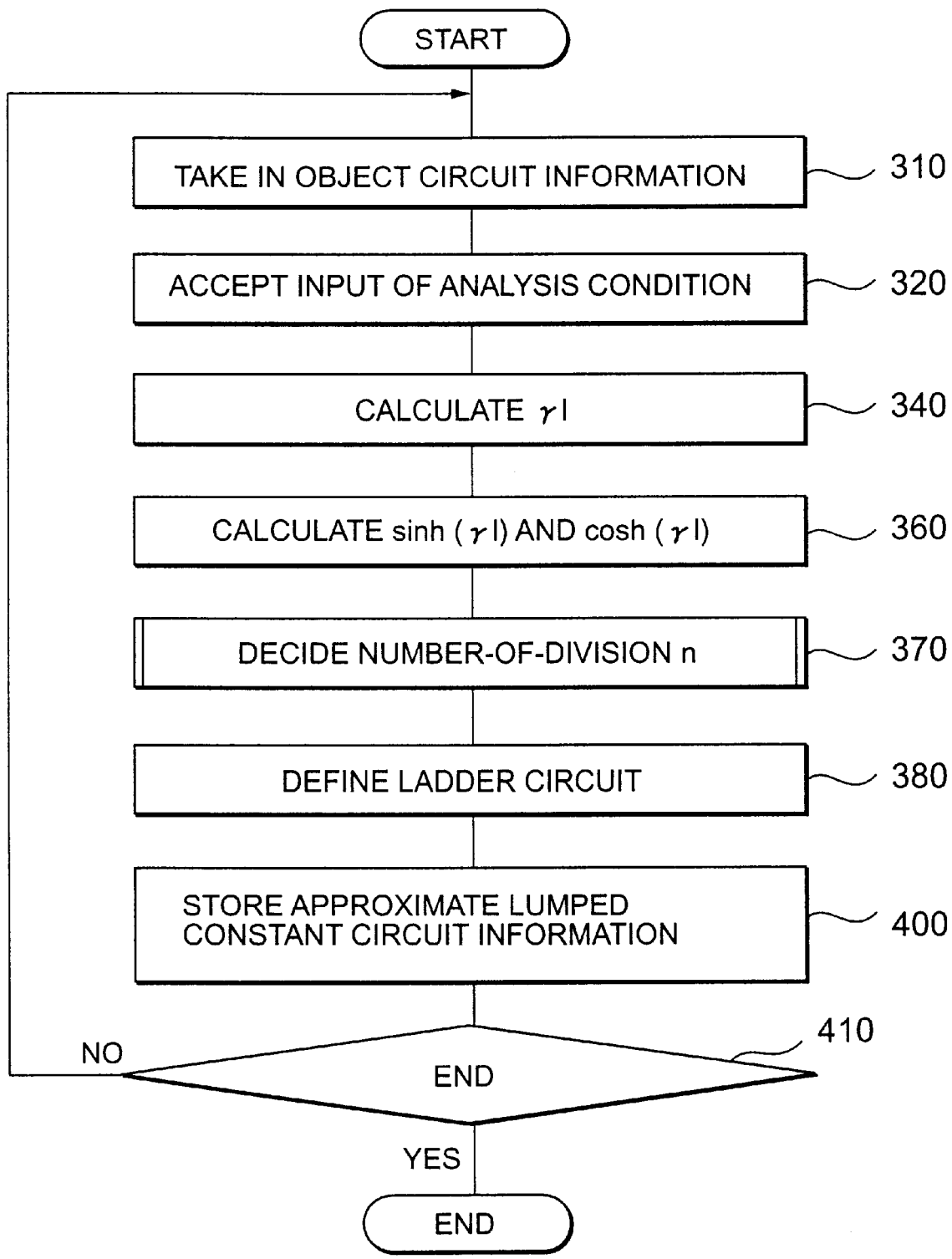
FIG. 9 is a flowchart showing a procedure for approximating a distributed constant line, according to the present invention.
Figure 10:
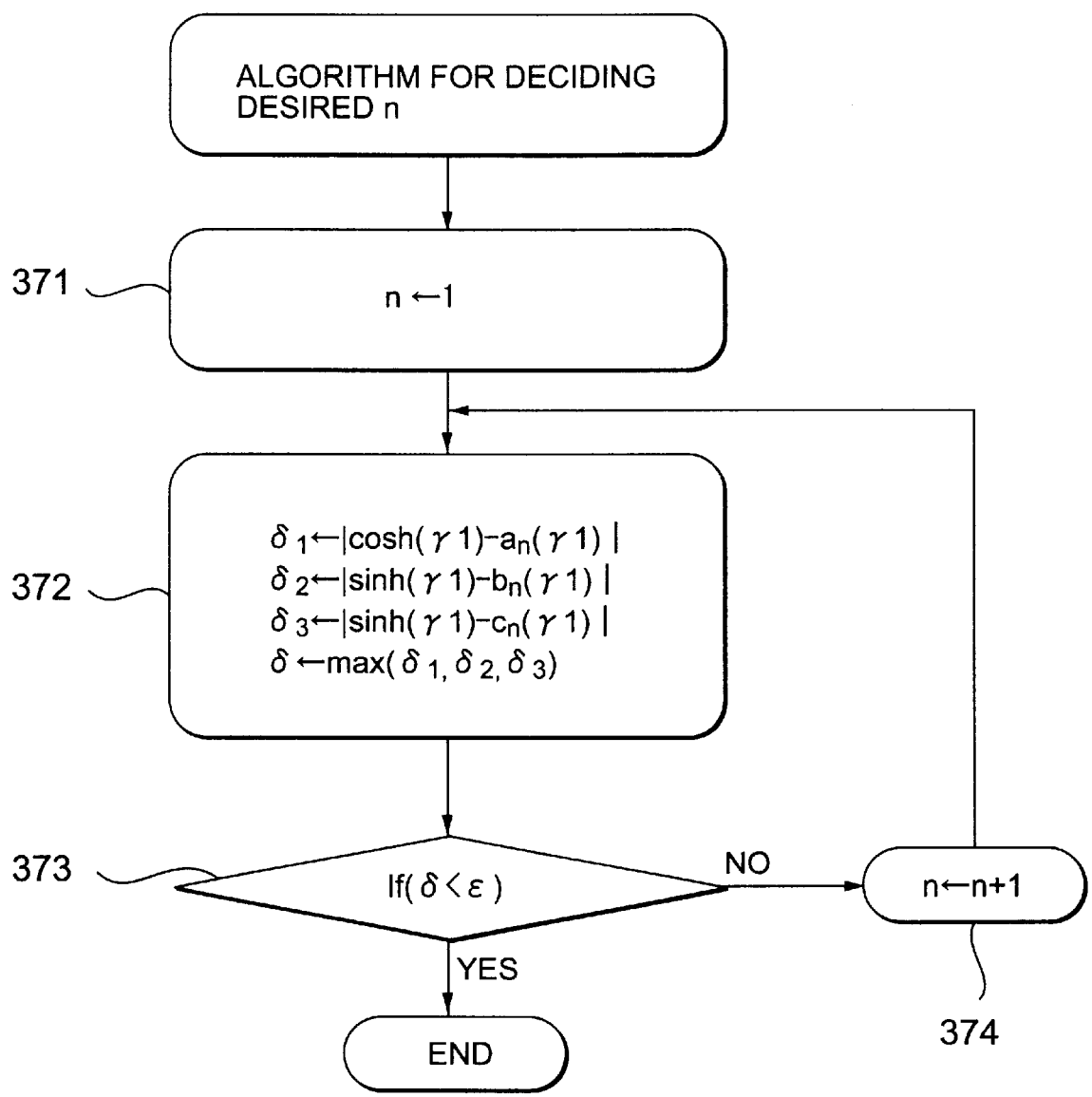
FIG. 10 is a flowchart showing a procedure for deciding the number of division in the above procedure.

A program executed by the CPU 110 performs such a procedure as shown in FIG. 9, for example. The process shown in FIG. 9 is one that takes in data on an object circuit to be analyzed and performs the approximation of a distributed constant line by a lumped constant circuit, based on that data. Further, the process shown in FIG. 10 is one of subroutines of the process shown in FIG. 9, and performs processing of deciding the number n of division for obtaining desired accuracy. Also, numerical formulas used in these processes are included in the program. Of course, dedicated programs may be provided for executing the operations on the numerical formulas. When the CPU 110 executes the program, it uses various pieces of information, and, at the same time, generates various pieces of intermediate information and final information. Such information includes the information shown in FIG. 8, for example.

FIG. 8 shows the various pieces of information used in the present invention, together with the flow of their processing. The various pieces of information include: object circuit information 200 that describes an object circuit becoming an object of the process; analysis condition information 240 that specifies analysis conditions for the object circuit in question; element information 250 on elements of a transfer matrix; number-of-division information 260; information 270 on lumped constant elements and their connection; and finally-integrated object circuit information 280 on the object of the circuit analysis.

As the object circuit information 200, object circuit information set by a circuit design support system such as a CAD system, or information inputted through the input device 130 to define the object circuit is received as input information. The object circuit information 200 includes: a distributed constant part 210 having circuit information concerning the part of the object circuit to be treated as a distributed constant line; a lumped constant part 220 having circuit information concerning the part of the object circuit that can be treated as lumped constant; and connection information 230 having information indicating connecting relationship between circuit elements. The distributed constant part 210 includes information on resistance R, inductance L, conductance G, capacitance C, and line length l shown in the above-described Table 1. In the present invention, using the information of the distributed constant part 210, approximation by lumped constant circuit is performed. Information on resistance R, inductance L, conductance G, capacitance C, and line length l is respectively given by numerical values as design values or measured values.

This object circuit information 200 is inputted into the system of the present invention, and stored, for example, in the hard disk unit 160. If necessary, the object circuit information 200 is also set in the memory 120. The object circuit information 200 may be prepared by various methods, including a case where the information is inputted from another system through the communication control unit, a case where the information is inputted through a portable storage medium, a case where the system of the present invention itself has a CAD function and the information is generated by that function and stored in the hard disk unit 160, for example.

Figure 11:
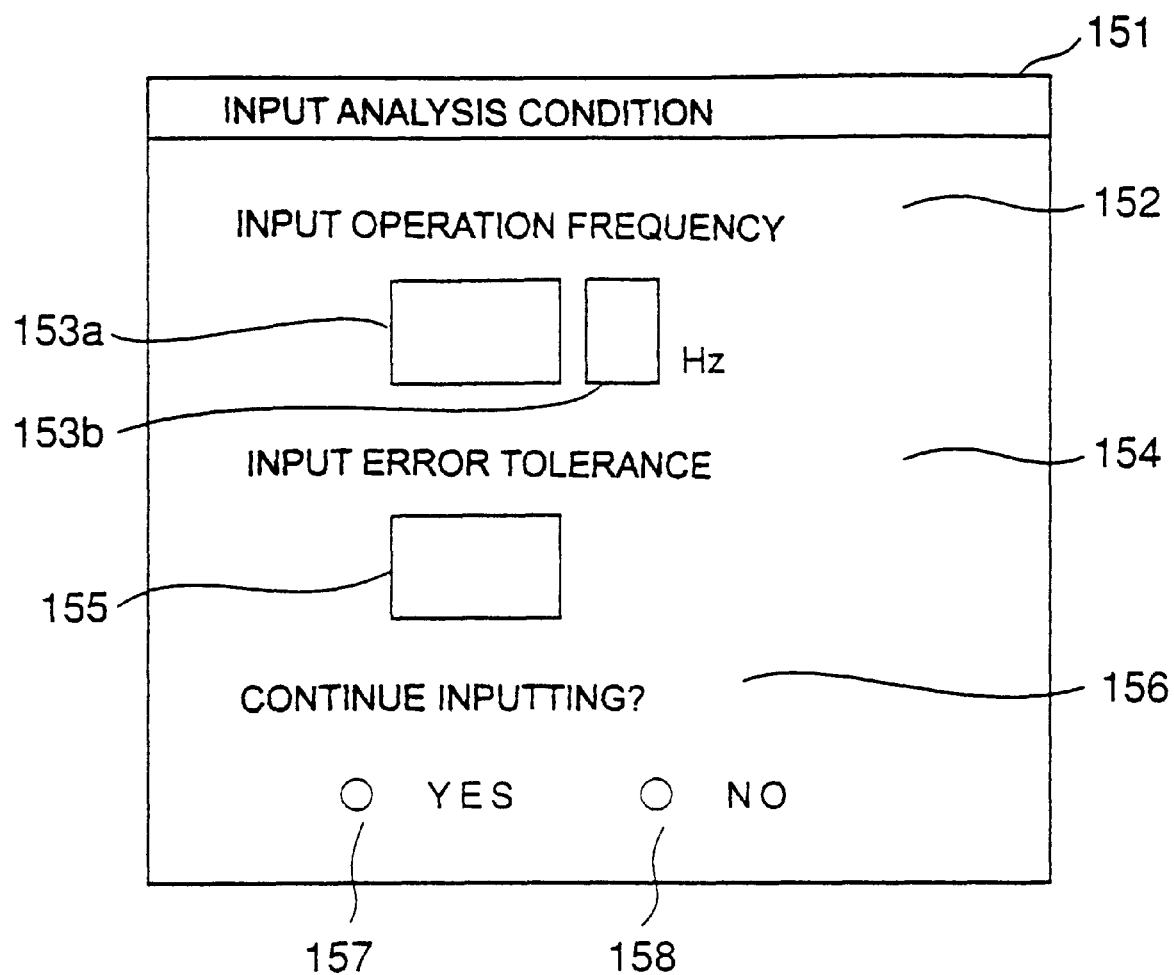
FIG. 11 is an explanatory view showing an example of a display screen used for inputting analysis conditions in the present invention.

As the analysis condition information 240, are used an operation angular frequency ω and an error tolerance ε. These are set in advance or each time. At setting, an input screen may be displayed on the display unit 150 as shown in FIG. 11 for example, and, input is carried out following the guidance in the screen. As for the operation angular frequency ω, FIG. 11 shows an example in which input is received in terms of operation frequency. Accordingly, the inputted frequency is transformed into an angular frequency before using. A plurality of values may be set to each of the operation angular frequency ω and the error tolerance ε, to perform the analysis for each value. The inputted operation angular frequency ω and error tolerance ε are stored into the memory 120. Further, when these pieces of information are to be retained, they are stored into the hard disk unit 160.

As for the element information 250 on element of a transfer matrix, different information is used depending on calculation to be performed, and the calculation is performed in compliance with this information. Here, sinh γl and cosh γl, which constitute elements of the transfer matrix, are obtained. To that end, using R, L, G, C and l contained in the above-mentioned distributed constant part and the operation angular frequency ω contained in the analysis conditions, the characteristic impedance $Z_0$ and the product γl of the propagation constant γ and the line length l are calculated employing the expressions (2) and (3). These pieces of information are stored in the memory 120. Further, if necessary, they are also stored into the hard disk unit 160.

Or, as the above-mentioned information 250, the transfer matrix $F_0$ may be obtained. Further, when γ is obtained in advance, it may be used. Similarly, when γl is obtained in advance, it may be used too.

Next, the number-of-division information 260 is a value that is decided to evaluate the error of the approximation. To decide this number-of-division information n, error of the approximation is evaluated. The error evaluation of the approximation is carried out by comparing corresponding elements in the above-mentioned $F_0$ and $F_n$ ($F_\Pi$ or $F_T$) to obtain errors and by judging if the largest one in those errors is less than or equal to a predetermined tolerance. For example, in the above expressions (4) and (11), corresponding elements are compared to evaluate the accuracy.

Namely, the accuracy is judged based on how accurately the function $a_n(\gamma l)$ approximates the hyperbolic cosine function cosh $\gamma l$, and how accurately the functions $b_n(\gamma l)$ and $c_n(\gamma l)$ approximate the hyperbolic sine function $\gamma l$. In detail, as shown in the following expression (20), absolute values $\delta_1$, $\delta_2$, $\delta_3$ of difference between corresponding elements are obtained, and the number of division n at which those values become less than the target accuracy (error tolerance $\epsilon$) is decided. In the case of the T circuit, difference between the expressions (4) and (12) is obtained.

$$\delta_1 \leftarrow |\cosh(\gamma l) - a_n(\gamma l)|$$
$$\delta_2 \leftarrow |\sinh(\gamma l) - b_n(\gamma l)|$$
$$\delta_3 \leftarrow |\sinh(\gamma l) - c_n(\gamma l)|$$
$$\delta \leftarrow \max(\delta_1, \delta_2, \delta_3) \quad (20)$$

Here, the functions $a_n(\gamma l)$, $b_n(\gamma l)$ and $c_n(\gamma l)$ are obtained from the corresponding expressions (13), (14) and (15), respectively. At that time, the number of division n is decided tentatively, and, that tentative number is used to obtain $a_n(\gamma l)$, $b_n(\gamma l)$ and $c_n(\gamma l)$ corresponding to that number of division.

The information obtained here is stored in the memory 120. Further, the information to be retained is stored into the hard disk unit 160.

Using the obtained number of division n, the information 270 on lumped constant elements and their connection defines a ladder circuit shown in FIG. 2 or 3. This information is stored in the memory 120, and, at the same time, into the hard disk unit 160.

The above-mentioned information 270 on lumped constant elements and their connection, lumped constant part circuit element contained in the lumped constant part 220, and the connection information contained in the connection information 230 are integrated to generate, as a whole, the object circuit information 280 on the object circuit described by the lumped constant circuit. The object circuit information 280 is stored in the memory 120 and/or the hard disk 160, together with the above-mentioned object circuit information and the analysis condition information 240.

This object circuit information 280 is delivered to a circuit analysis system in a subsequent stage and analyzed there. Here, after the object circuit information 280 is delivered to the circuit analysis system in the subsequent stage, that information 280 may be deleted without being recorded in the present system.

Next, the above-mentioned approximation process will be described referring to a flowchart showing the procedure. FIG. 9 shows the flow of the approximation process according to the present invention.

In FIG. 9, when the CPU 110 receives an instruction from the input device 130, the CPU 110 takes in the object circuit information (Step 310). This taking-in is carried out, for example, by using the communication control unit 140 to receive the information from a CAD system not shown, via a communication means such as LAN, etc. Or, in the case that the object circuit information is stored in the portable storage medium 180, the information can be taken in from that portable storage medium 180 through the portable storage medium drive 170. Or, the information may be taken in through the input device 130 by manual input. Further, in the case that the information processing apparatus, which constitutes the system of the present invention, functions also as a CAD system, then, the information in question may be taken in from the hard disk unit 160. The object circuit information taken in is stored into the memory 120. Further, when this information is to be retained, it is stored into the hard disk unit 160.

As described above, the object circuit information 200 comprises the distributed constant part 210, the lumped constant part 220, and the connection information 230. Here, it suffices to take in the distributed constant part 210. Of course, the lumped constant part 220 and the connection information 230 may be taken in together. The CPU 110 works to store the each piece of the taken-in information into the memory 120.

The CPU 110 receives input of the analysis conditions (Step 320). The CPU 110 displays an analysis condition input screen (window) such as shown in FIG. 11, on the display screen of the display unit 150, to request the input of required items. In the case of the analysis condition input screen 151 shown in FIG. 11, input areas are displayed together with messages that prompt input. Namely, a message such as "Please input an operation frequency" together with associated input areas 153a and 153b, a message 154 such as "Please input an error tolerance" together with an associated input area 155, and a message 156 such as "Is input to be continued?" together with associated "YES" input area 157 and "NO" input area 158 are displayed on the analysis condition input screen 151. Here, the input area 153a is an area for inputting a value that expresses a frequency. The input area 153b is an area for inputting a symbol that expresses magnitude such as mega (M) or giga (G). With respect to the area 153a, 153b or 155, when a value is inputted through the input device 130, then, the CPU 110 makes the inputted value displayed in the corresponding area.

Further, when the "YES" input area 157 is selected, then, the CPU 110 makes the memory 120 record the items that has been inputted up to that time, and proceeds to another process. On the other hand, when the "NO" input area 158 is selected, then, the values that have been inputted up to that time are recorded in the memory 120, and the analysis condition input screen 151 is displayed in the state of no input in order to receive input.

Here, analysis conditions prepared as standards by the system may be displayed, and, when those conditions can be used as they are, a confirmatory instruction may be received. The analysis conditions that have been set are stored into the memory 120.

The CPU 110 uses the data of the distributed constant part 210 stored in the memory 120 to calculates the product $\gamma l$ of the propagation constant $\gamma$ and the line length l of the distributed constant line expressed by that data, and makes the memory 120 record the product (Step 340). Further, the CPU 110 uses the product $\gamma l$ stored in the memory 120 to calculate cosh $\gamma l$ and sinh $\gamma l$ constituting the elements of the F matrix $F_0$ shown in the expression (4) (Step 360). Then, the CPU 110 makes the calculated result stored into the memory 120.

Next, the process of deciding the number of division n is carried out. In this process, as shown in FIG. 10, first the number of division n is set as an initial value "1" (Step 371). Then, the absolute values $\delta_1$, $\delta_2$, $\delta_3$ and the maximum $\delta$ among the absolute values $\delta_1$, $\delta_2$, $\delta_3$ are obtained (Step 372). The absolute values $\delta_1$, $\delta_2$, $\delta_3$ are obtained by using the expression (20). In detail, they are obtained as follows. First, the expressions (13), (14) and (15) are used to obtain the functions $a_n(\gamma l)$, $b_n(\gamma l)$ and $c_n(\gamma l)$, and these functions are stored into the memory 120. Next, the expression (20) is used to obtain deviations between cosh $\gamma l$, sinh $\gamma l$, which have already been calculated and are stored in the memory 120, and the corresponding functions $a_n(\gamma l)$, $b_n(\gamma l)$, $c_n(\gamma l)$.

Then, the absolute values of those deviations are stored into the memory 120 as $\delta_1$, $\delta_2$, and $\delta_3$. Next, $\delta_1$, $\delta_2$, and $\delta_3$ stored in the memory 120 are compared with one another in their magnitude to select the maximum $\delta$.

Here, the initial value of the number of division n is not limited to "1". When n is expected to be a large value, a value close to the expected value may be set as the initial value. When a large value is set as n, it may happen that the set value satisfies the conditions from the beginning. In that case, the value of n may be decreased gradually to a value of n that satisfies the conditions on the margin.

The CPU 110 compares the obtained $\delta$ with the error tolerance $\epsilon$ stored in the memory 120 (Step 373). When $\delta<\epsilon$, then, this process is ended since the targeted number of division is obtained (Step 373). When $\delta<\epsilon$ is not satisfied, the number of division is increased by 1 (Step 374), and the procedure returns to Step 372 to repeat the above-described process.

Figure 4:
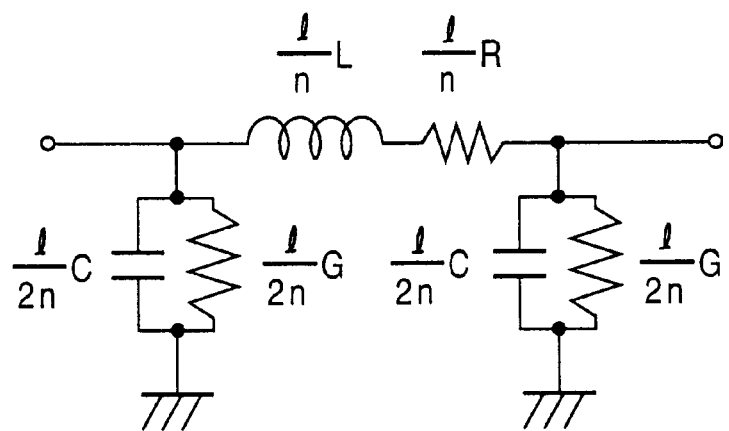
FIG. 4 is a circuit diagram showing an example of structure of the Π circuit shown in the above FIG. 2.
Figure 5:
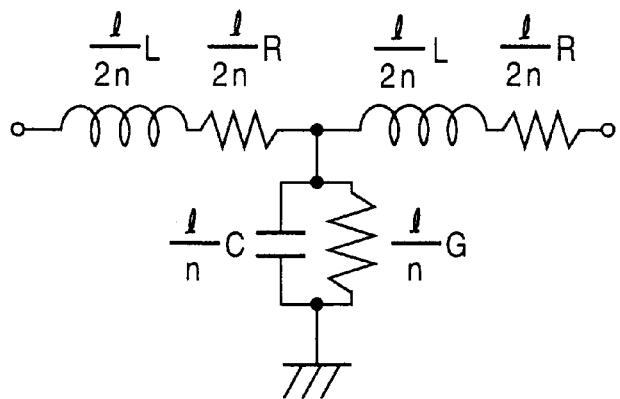
FIG. 5 is a circuit diagram showing an example of structure of the T circuit shown in the above FIG. 3.

When the targeted number of division n is decided, the CPU 110 proceeds to the process of Step 380 shown in FIG. 9. Namely, the CPU 110 assigns a Π circuit such as shown in FIG. 4 as a unit lumped constant circuit to each subinterval determined by the number of division obtained, and defines a ladder circuit by connecting this Π circuit in cascade (Step 380). Of course, a unit lumped constant circuit to be employed is not limited to the Π circuit. For example, a T circuit as shown in FIG. 5 may be employed.

The CPU 110 stores the information on the defined approximate lumped constant circuit into the hard disk unit 160 (Step 400). If there is no more process, then, a series of processes is ended (Step 410). On the other hand, when there exist any more objects to be approximated, then the procedure returns to Step 310.

Here, it is also possible that, based on the ladder circuits defined, the lumped constant circuit parts having lumped constant circuit elements and connection information are extracted so that those pieces of information are integrated into the lumped constant part 220 and the connection information 230 shown in FIG. 8, respectively. In that case, the information on the approximate lumped constant circuit as a result of the integration is stored into the hard disk unit 160.

Next, an embodiment of the present invention will be described. The present embodiment will be described referring to an example in which the present invention is applied to a process of lumped constant approximation on a conductive line formed on a circuit board that has such a cross section as shown in FIG. 12.

Figure 12:
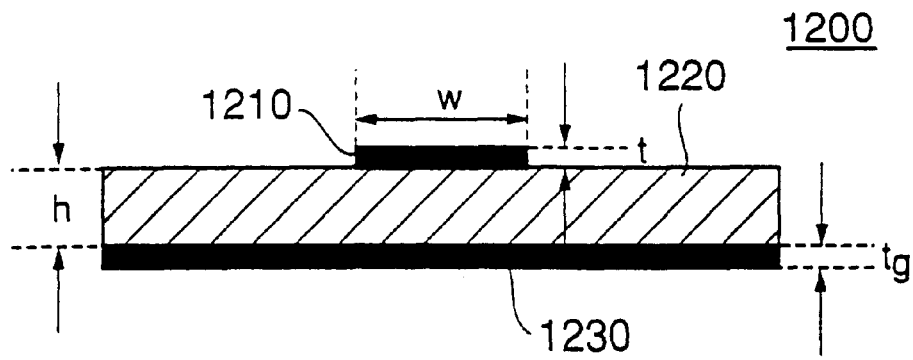
FIG. 12 is a sectional view showing structure of a circuit board as an object of applying an embodiment of the present invention.

The circuit board 1200 shown in FIG. 12 comprises a conductor forming a ground layer 1230, a substrate 1220 of a dielectric provided on the ground layer, and a wiring part 1210 placed on the substrate 1220. Here, the wiring part 1210 and the ground layer 1230 are formed of copper. Further, the substrate 1220 is made of glass epoxy resin. In the present embodiment, sizes of various parts of the circuit board 1200 as an object of the analysis are shown in FIG. 2.

TABLE 2

| Symbol | Size | Unit |
| --- | --- | --- |
| w | wiring width | 100 | μm |
| h | substrate thickness | 90 | μm |
| t | wiring thickness | 16 | μm |
| tg | ground layer thickness | 18 | μm |
| l | wiring length | 25 | μm |

Further, measured values on R, L, G and C shown in Table 1 are ones shown in Table 3.

TABLE 3

| Symbol | Measured value | Unit |
| --- | --- | --- |
| R | 34.2 | Ω/m |
| L | 1.19 | μH/m |
| G | 0 | S/m |
| C | 0.11 | nF/m |

Further, as the analysis conditions, the operation frequency of 100 MHz and each of three kinds of error tolerance (relative value), 1%, 3% and 5% are inputted through the input device 130.

Using thus-described inputted information, the processes shown in FIGS. 9 and 10 are executed by the CPU 110. In consequence, the following results have been obtained as the decided number of division n.

| When $\epsilon = 1\%$, | $n = 13$ |
| When $\epsilon = 3\%$, | $n = 8$ |
| When $\epsilon = 5\%$, | $n = 6$ |

As is obvious from the above result, the number of division can be decided depending on the magnitude of the error tolerance $\epsilon$ for the approximation. Thus, the number of division can be decided in accordance with the accuracy of the approximation, and it is assured that required approximating accuracy is obtained. Conversely, by employing a number of division that satisfying a required accuracy, unnecessary processing caused by an excessive number of division can be avoided. In addition, as described above, the kinds of data required for deciding the number of division are limited, and the required calculation is small. Thus, even if the process of deciding the number of division is carried out in addition to the approximation process, it does not entail a large burden on CPU.

Thus, as described hereinabove, concerning a circuit having line parts that are to be treated as distributed constant in a circuit board etc., it is possible to convert the distributed constant parts to lumped constant with target accuracy, and to analyze the object circuit in the lumped constant state.

In the description of the present embodiment, there has been no explicit process for selecting a type of circuit. However, as a type of circuit, a plurality of types can be conceived. Thus, a plurality of types may be prepared in advance, in order to select any one. Of course, a certain circuit may be set as a standard designation so that it is used unless there is a specific designation.

Further, in the above-described embodiment, the evaluation of an error is carried out employing an absolute error as the tolerance. However, the present invention is not limited to this, and, for example, a relative error may be used. For example, ratios such as:

$\delta_1/|\cosh \gamma l|$
$\delta_2/|\sinh \gamma l|$
$\delta_3/|\sinh \gamma l|$ may be used to evaluate errors.

Figure 13:
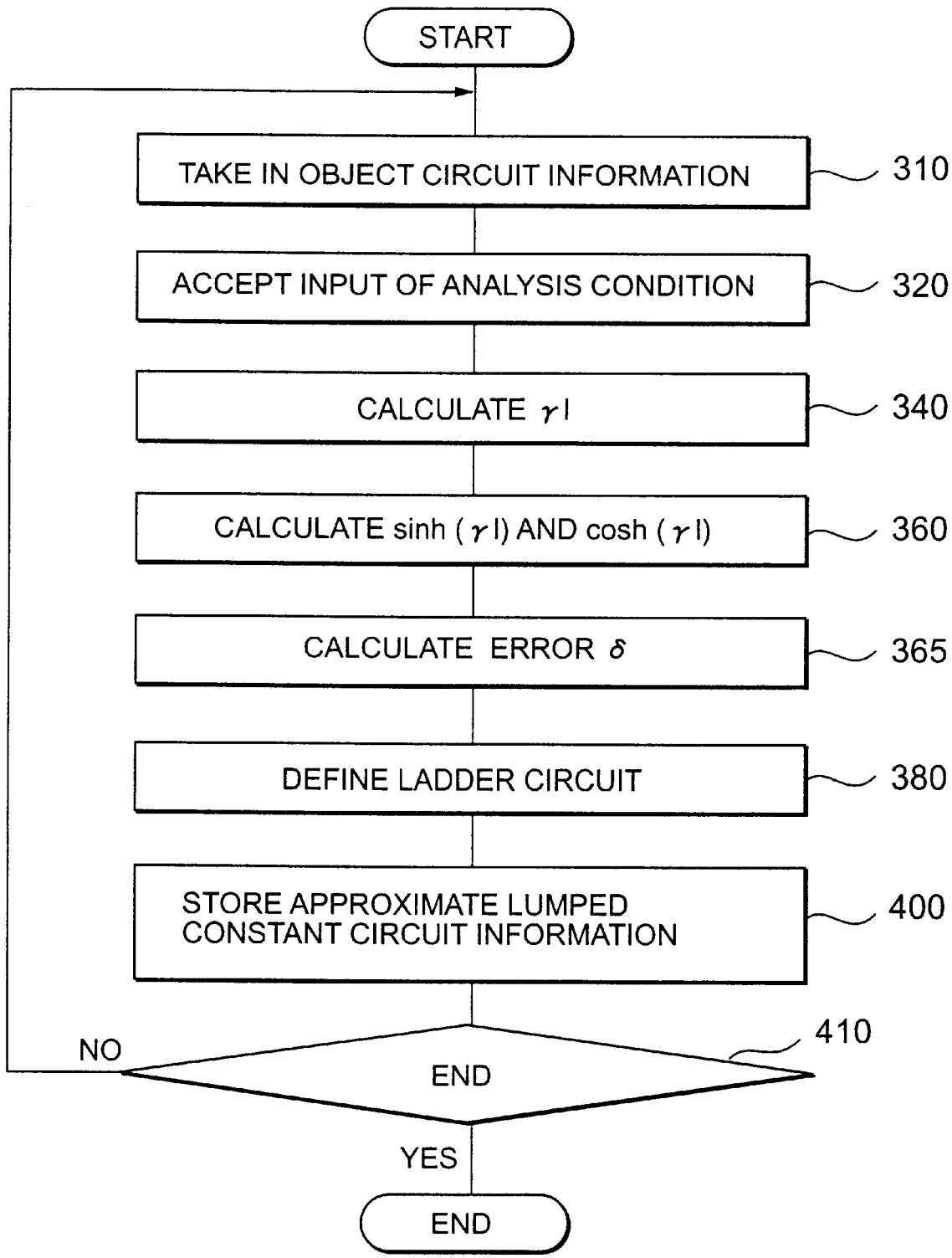
FIG. 13 is a flowchart showing another example of a procedure for approximating a distributed constant line according to the present invention.

Further, the above description has referred to the example in which the number of division n is decided to satisfy a given error tolerance. The present invention is not limited to this. For example, the present invention can be applied to a case where, when the number of division n is designated, an error tolerance $\epsilon$ corresponding to that n should be obtained. FIG. 13 shows an example of a procedure followed in that case.

In FIG. 13, the same step number is given to the same process as in the flowchart shown in FIG. 9, avoiding the repeated description.

Similarly to the case shown in FIG. 9, the CPU 110 takes in the object circuit information (Step 310), and makes it stored into the memory 120. Next, input of the analysis conditions is received (Step 320). Here, however, instead of input of an error tolerance ϵ, designation of the number of division n is received. Next, γl is calculated (Step 340), and sinh γl and cosh γl are calculated (Step 360).

Thereafter, the error δ corresponding to the given number of division n is obtained (Step 365). This process is carried out as follows, for example. The expressions (13), (14) and (15) are used to obtain the functions $a_n(γl)$, $b_n(γl)$ and $c_n(γl)$, which are, then, stored into the memory 120. Next, a deviation between cosh γl and sinh γl which have already been calculated and stored in the memory 120 and the functions $a_n(γl)$, $b_n(γl)$ and $c_n(γl)$ using the expression (20), and then, the absolute values thereof are stored in the memory as $δ_1$, $δ_2$, $δ_3$. Next, the CPU 110 compares $δ_1$, $δ_2$, $δ_3$ stored in the memory with one another in their magnitude, to select the maximum δ. Then, the selected δ is displayed as the error on the display unit 150.

Thereafter, for example, a ladder circuit is defined (Step 380), and it is retained in the hard disk unit 160 (Step 400). When all the parts to be processed are finished, the process is ended (Step 410).

According to the example shown in FIG. 13, using the given number of division n, it is possible to know how accurately a distributed constant line is approximated by a lumped constant circuit.

The present invention can carry out both processes shown in FIGS. 9 and 13. Namely, the procedure can be so set that, depending on which of error tolerance ϵ and the number of division n is inputted as the analysis condition, it is automatically selected which of the processes shown in FIGS. 9 and 13 is to be carried out. Of course, it is possible that both error tolerance ϵ and the number of division n are inputted as the analysis conditions, and an instruction is given from outside to carry out which of the processes shown in FIGS. 9 and 13.

In each of the above-described examples, the deviations between cosh γl, sinh γl and the functions $a_n(γl)$, $b_n(γl)$, $c_n(γl)$ are calculated to obtain their absolute values $δ_1$, $δ_2$ and $δ_3$ by the expression (20). However, the present invention is not limited to this. For example, instead of the absolute values, the deviations may be used.

Further, in the above examples, the hard disk unit 160 and the memory 120 are used to carry out various processes. The present invention, however, is not limited to this. For example, only the memory 120 of large capacity may be used to carry out all the above-described processes. Further, when the contents of the memory 120 are retained, they may be stored into the hard disk unit 160.

What is claimed is:

1. A method of approximating a distributed constant line, which employs an information processing apparatus to perform a process of approximating an object distributed constant line by a lumped constant circuit obtained by cascading a given unit lumped constant circuit in n stages, comprising the steps of:

calculating a product γl of a propagation constant γ of the object distributed constant line and a line length l of said distributed constant line, and storing said product;

calculating cosh γl and sinh γl, using said γl, and storing said cosh γl and sinh γl;

calculating $a_n(γl)$, $b_n(γl)$ and $c_n(γl)$ that constitute elements of a transfer matrix of said lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting x=γl and deciding n as a tentative value, and storing said $a_n(γl)$, $b_n(γl)$ and $c_n(γl)$;

comparing said cosh γl with $a_n(γl)$, sinh γl with $b_n(γl)$, and sinh γl with $c_n(γl)$, respectively, to make a judgment on whether a result of comparison satisfies a predetermined condition, and, when said condition is not satisfied, repeating steps from said step of calculating said $a_n(γl)$, $b_n(γl)$ and $c_n(γl)$, onward, changing the value of said n, until said result of comparison satisfies said condition; and deciding an approximate circuit, using n when said result of comparison satisfies said condition, in order to decide, as the approximate circuit, a lumped constant circuit that is obtained by cascading said unit lumped constant circuits in n stages.

2. The method of approximating a distributed constant line according to claim 1, wherein:

said comparison is carried out by calculating a deviation between said cosh γl and $a_n(γl)$, a deviation between sinh γl and $b_n(γl)$, and a deviation between sinh γl and $c_n(γl)$, respectively, and said result of comparison is obtained as a maximum δ among those deviations; and a condition that said maximum δ satisfies δ<ϵ for an error tolerance ϵ set in advance is used as said condition to make said judgment.

3. The method of approximating a distributed constant line according to claim 1, wherein:

said lumped constant circuit is constituted by cascading Π circuits as said unit lumped constant circuits in n stages, and said transfer matrix of the lumped constant circuit is given by an expression:

$$F_\Pi = \begin{bmatrix} a_n(γl) & Z_0 b_n(γl) \\ \frac{1}{Z_0} c_n(γl) & a_n(γl) \end{bmatrix}$$

where $Z_0$ is a characteristic impedance of said distributed constant line.

4. The method of approximating a distributed constant line according to claim 1, wherein:

said lumped constant circuit is constituted by cascading T circuits as said unit lumped constant circuits in n stages, and said transfer matrix of the lumped constant circuit is given by an expression:

$$F_T = \begin{bmatrix} a_n(\gamma l) & Z_0 c_n(\gamma l) \\ \frac{1}{Z_0} b_n(\gamma l) & a_n(\gamma l) \end{bmatrix}$$

where $Z_0$ is a characteristic impedance of said distributed constant line.

5. The method of approximating a distributed constant line according to claim 2, wherein:
  input of said error tolerance $\epsilon$ is received and stored; and
  said received $\epsilon$ is used in the condition to decide the value of said n.

6. The method of approximating a distributed constant line according to claim 2, wherein:
  as said error tolerance $\epsilon$, input of a plurality of values is received and stored; and
  each of said received values for $\epsilon$ is used in the condition to decide each corresponding value of said n.

7. A method of approximating a distributed constant line, which employs an information processing apparatus to perform a process of approximating an object distributed constant line by a lumped constant circuit obtained by cascading a given unit lumped constant circuit in n stages, comprising the steps of:
  receiving input of a value of said n, and storing said value;
  calculating a product $\gamma l$ of a propagation constant $\gamma$ of the object distributed constant line and a line length l of said distributed constant line, and storing said product;
  calculating $\cosh \gamma l$ and $\sinh \gamma l$, using said $\gamma l$, and storing said $\cosh \gamma l$ and $\sinh \gamma l$;
  calculating $a_n(\gamma l)$, $b_n(\gamma l)$ and $c_n(\gamma l)$ that constitute elements of a transfer matrix of said lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x = \gamma l$ and deciding n as said value inputted, and storing said $a_n(\gamma l)$, $b_n(\gamma l)$ and $c_n(\gamma l)$; and
  calculating a deviation between said $\cosh \gamma l$ and $a_n(\gamma l)$, a deviation between $\sinh \gamma l$ and $b_n(\gamma l)$, and a deviation between $\sinh \gamma l$ and $c_n(\gamma l)$, respectively, obtaining a maximum $\delta$ among those deviations, and outputting said maximum $\delta$ as an error.

8. A system for approximating an object distributed constant line by a lumped constant circuit, comprising:
  means for storing object circuit information describing the distributed constant line as an object of approximation, and approximate circuit information defining a lumped constant circuit obtained by cascading a given unit lumped constant circuit in n stages;
  means for calculating a product $\gamma l$ of a propagation constant $\gamma$ of the object distributed constant line and a line length l of said distributed constant line based on said object circuit information;
  means for calculating $\cosh \gamma l$ and $\sinh \gamma l$ using said $\gamma l$;
  means for calculating each of $a_n(\gamma l)$, $b_n(\gamma l)$ and $c_n(\gamma l)$ that constitute elements of a transfer matrix of said lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting $x = \gamma l$ and deciding n as a tentative value;
  means for deciding said n by comparing said $\cosh \gamma l$ with $a_n(\gamma l)$, $\sinh \gamma l$ with $b_n(\gamma l)$, and $\sinh \gamma l$ with $c_n(\gamma l)$, respectively, to make a judgment on whether a result of comparison satisfies a predetermined condition, and, when said condition is not satisfied, by repeating processes from a process of calculating said $a_n(\gamma l)$, $b_n(\gamma l)$ and $c_n(\gamma l)$, onward, changing the value of said n, until said result of comparison satisfies said condition; and
  means for deciding an approximate circuit, said means using n when said result of comparison satisfies said condition, in order to decide, as the approximate circuit, a lumped constant circuit that is obtained by cascading said unit lumped constant circuit in n stages.

9. The system for approximating a distributed constant line, according to claim 8, wherein:
  said means for deciding n:
    carries out said comparison by calculating a deviation between said $\cosh \gamma l$ and $a_n(\gamma l)$, a deviation between $\sinh \gamma l$ and $b_n(\gamma l)$, and a deviation between $\sinh \gamma l$ and $c_n(\gamma l)$, respectively, to obtain said result of comparison as a maximum $\delta$ among those deviations; and
    makes said judgment by using a condition that said maximum $\delta$ and an error tolerance $\epsilon$ set in advance satisfy $\delta < \epsilon$, as said condition.

10. The system for approximating a distributed constant line according to claim 8, wherein:
  said system further comprises means for receiving designation from outside;
  said means for storing possesses approximate circuit information on a lumped constant circuit constituted by cascading a $\Pi$ circuit as said unit lumped constant circuit in n stages, and approximate circuit information on a lumped constant circuit constituted by cascading a T circuit as said unit lumped constant circuit in n stages;
  said means for calculating $a_n(\gamma l)$, $b_n(\gamma l)$ and $c_n(\gamma l)$ calculates $a_n(\gamma l)$, $b_n(\gamma l)$ and $c_n(\gamma l)$ concerning the lumped constant circuit constituted by cascading, in n stages, the unit lumped constant circuit that is designated through said means for receiving designation between said $\Pi$ circuit and T circuit; and
  said means for deciding the approximate circuit decides, as the approximate circuit, said lumped constant circuit constituted by cascading said designated unit lumped constant circuit in n stages.

11. A system for approximating an object distributed constant line by a lumped constant circuit, wherein,
said system comprises:
a storage device for storing a program and data; and
a central processing unit for executing said program to perform said approximation;
said storage device stores object circuit information describing the distributed constant line as an object of approximation, and approximate circuit information defining a lumped constant circuit obtained by cascading a given unit lumped constant circuit in n stages to approximate; and
said central processing unit carries out processes of:
calculating a product γl of a propagation constant γ of the object distributed constant line and a line length l of said distributed constant line based on said object circuit information;
calculating cosh γl and sinh γl using said γl;
calculating each of $a_n(\gamma l)$, $b_n(\gamma l)$ and $c_n(\gamma l)$ that constitute elements of a transfer matrix of said lumped constant line, from functions $a_n(x)$, $b_n(x)$ and $c_n(x)$ defined by following three expressions:

$$a_n(x) = \sum_{k=0}^{n} \frac{(n+k-1)!}{n^{2k-1}(n-k)!} \frac{x^{2k}}{(2k)!}$$

$$b_n(x) = \sum_{k=0}^{n-1} \frac{(n+k)!}{n^{2k+1}(n-k-1)!} \frac{x^{2k+1}}{(2k+1)!}$$

$$c_n(x) = \sum_{k=0}^{n} \frac{\left(n^2 + \frac{k}{2}\right)(n+k-1)!}{n^{2k+1}(n-k)!} \frac{x^{2k+1}}{(2k+1)!}$$

putting x=γl and deciding n as a tentative value;
deciding said n by comparing said cosh γl with $a_n(\gamma l)$, sinh γl with $b_n(\gamma l)$, and sinh γl with $c_n(\gamma l)$, respectively, to make a judgment on whether a result of comparison satisfies a predetermined condition, and, when said condition is not satisfied, by repeating the processes from the process of calculating said $a_n(\gamma l)$, $b_n(\gamma l)$ and $c_n(\gamma l)$, onward, changing the value of said n, until said result of comparison satisfies said condition; and
deciding an approximate circuit, using n when said result of comparison satisfies said condition, in order to decide, as the approximate circuit, lumped constant circuit obtained by cascading said unit lumped constant circuit in n stages.

12. A program recorded medium in which a program for making an information processing apparatus execute a process of approximating an object distributed constant line by a lumped constant circuit obtained by cascading a given unit lumped constant circuit in n stages is recorded, wherein:
said program makes said information processing apparatus execute processes of:
calculating a product γl of a propagation constant γ of the object distributed constant line and a line length l of said distributed constant line based on object circuit information describing said object distributed constant line;
calculating cosh γl and sinh γl using said γl;
calculating each of $a_n(\gamma l)$, $b_n(\gamma l)$ and $c_n(\gamma l)$ that constitute elements of a transfer matrix of said lumped constant line, from functions $a_n(\chi)$, $b_n(\chi)$ and $c_n(\chi)$ defined by the following three expressions:

$$a_n(\chi) = \sum_{k=0}^{n} \frac{(n+k-1)!}{n^{2k-1}(n-k)!} \frac{\chi^{2k}}{(2k)!}$$

$$b_n(\chi) = \sum_{k=0}^{n-1} \frac{(n+k)!}{n^{2k+1}(n-k-1)!} \frac{\chi^{2k+1}}{(2k+1)!}$$

$$c_n(\chi) = \sum_{k=0}^{n} \frac{\left(n^2 + \frac{k}{2}\right)(n+k-1)!}{n^{2k+1}(n-k)!} \frac{\chi^{2k+1}}{(2k+1)!}$$

putting χ=γl and deciding n as a tentative value;
deciding said n by comparing said cosh γl with $a_n(\gamma l)$, sinh γl with $b_n(\gamma l)$, and sinh γl with $c_n(\gamma l)$, respectively, to make a judgment on whether a result of comparison satisfies a predetermined condition, and, when said condition is not satisfied, by repeating the processes from the process of calculating said $a_n(\gamma l)$, $b_n(\gamma l)$ and $c_n(\gamma l)$, onward, changing the value of said n, until said result of comparison satisfies said condition; and
deciding an approximate circuit, using n when said result of comparison satisfies said condition, in order to decide, as the approximate circuit, the lumped constant circuit that is obtained by cascading said stored unit lumped constant circuit in n stages.

13. The program recorded medium according to claim 12, wherein:
said program:
makes said comparison carried out by calculating a deviation between said cosh γl and $a_n(\gamma l)$, a deviation between sinh γl and $b_n(\gamma l)$, and a deviation between sinh γl and $c_n(\gamma l)$, respectively, to obtain said result of comparison as a maximum δ among those deviations; and
makes said judgment carried out by using a condition that said maximum δ and an error tolerance ε set in advance satisfy δ<ε, as said condition.

14. A program for making an information processing apparatus execute a process of approximating an object distributed constant line by a lumped constant circuit obtained by cascading a given unit lumped constant circuit in n stages, wherein:
said program makes said information processing apparatus execute processing of:
calculating a product γl of a propagation constant γ of the object distributed constant line and a line length l of said distributed constant line based on object circuit information describing the object distributed constant line;
calculating cosh γl and sinh γl using said γl;
calculating each of $a_n(\gamma l)$, $b_n(\gamma l)$ and $C_n(\gamma l)$ that constitute elements of a transfer matrix of said lumped constant line, from functions $a_n(\chi)$, $b_n(\chi)$ and $c_n(\chi)$ defined by the following three expressions:

$$a_n(\chi) = \sum_{k=0}^{n} \frac{(n+k-1)!}{n^{2k-1}(n-k)!} \frac{\chi^{2k}}{(2k)!}$$

-continued $$b_n(\chi) = \sum_{k=0}^{n-1} \frac{(n+k)!}{n^{2k+1}(n-k-1)!} \frac{\chi^{2k+1}}{(2k+1)!}$$

$$c_n(\chi) = \sum_{k=0}^{n} \frac{\left(n^2 + \frac{k}{2}\right)(n+k-1)!}{n^{2k+1(n-k)!}} \frac{\chi^{2k+1}}{(2k\ 1)!}$$

putting $\chi=\gamma l$ and deciding n as a tenative value;
deciding said n by comparing said cosh $\gamma l$ with $a_n(\gamma l)$, sinh $\gamma l$ with $b_n(\gamma l)$, and sinh ($\gamma l$), respectively, to make a judgement on whether a result of comparision satisfies a predetermined condition, and, when said condition is not satisfied, by repeating the processes from the process of calculating said $a_n(\gamma l)$, $b_n(\gamma l)$ and $c_n(\gamma l)$, onward, changing the value of said n, until said result of comparison satisfies said condition; and deciding an approximate circuit, using n when said result of comparison satisfies said condition, in order to decide, as the approximate circuit, the lumped constant circuit that is obtained by cascading said unit lumped constant circuit in n stages.

15. The program according to claim 14, wherein said program makes said comparison carried out by calculating a deviation between said cosh $\gamma l$ and $a_n(\gamma l)$, a deviation between sinh $\gamma l$ and $b_n(\gamma l)$, a deviation beteween sinh $\gamma l$ and $b_n(\gamma l)$, and a deviation between sinh $\gamma l$ and $c_n(\gamma l)$, respectively, to obtain said result of comparison as a maximum $\delta$ among those deviations; and makes said judgement carried out by using a condition that said maximum $\delta$ and an error tolterance $\epsilon$ set in advance satisfy $\delta<\epsilon$, as said condition.

* * * * *